United States Patent
Keller et al.

(10) Patent No.: US 6,637,012 B2
(45) Date of Patent: Oct. 21, 2003

(54) METHOD AND SYSTEM FOR IDENTIFYING FETS IMPLEMENTED IN A PREDEFINED LOGIC EQUATION

(75) Inventors: S. Brandon Keller, Evans, CO (US); Gregory Dennis Rogers, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/994,151

(22) Filed: Nov. 26, 2001

(65) Prior Publication Data

US 2003/0101422 A1 May 29, 2003

(51) Int. Cl.[7] .............................................. G06F 17/50
(52) U.S. Cl. ......................... 716/4; 716/1; 716/3; 716/5
(58) Field of Search ................................... 716/1, 2–21

(56) References Cited

U.S. PATENT DOCUMENTS

| | | | | |
|---|---|---|---|---|
| 5,805,462 A | * | 9/1998 | Poirot et al. | 716/18 |
| 5,910,898 A | * | 6/1999 | Johannsen | 716/1 |
| 6,308,301 B1 | * | 10/2001 | McBride et al. | 716/4 |
| 6,473,885 B1 | * | 10/2002 | Wallace | 716/4 |
| 2002/0038446 A1 | * | 3/2002 | Ioudovski | 716/3 |
| 2002/0112215 A1 | * | 8/2002 | Keller et al. | 716/4 |
| 2002/0166104 A1 | * | 11/2002 | Wu et al. | 716/12 |

OTHER PUBLICATIONS

A. Lester et al, "YAGLE, a second generation functional abstarctor for CMOS VLSI circuits", ICM '98, Proceedings of the tenth International Conference on Microelectronics, Dec. 1998, pp 265–269.*

* cited by examiner

Primary Examiner—Vuthe Siek
Assistant Examiner—Magid Y Dimyan

(57) ABSTRACT

A method for identifying FETs implemented in a predefined logic equation defined by at least one signal name from a netlist having output nodes, supply voltages with their opposite supply voltages, and FETs with their connectivity, that includes the steps of selecting an output node from the netlist, preparing the predefined logic equation for searching FETs in the netlist, and identifying FETs from the netlist that are implemented in the prepared predefined logic equation.

20 Claims, 4 Drawing Sheets

EQUATION: $\overline{A\,[(BD+C)E+F]}$

N-TREE   EQN: $A(BDE+CE+F) = ABDE+ACE+AF$

P-TREE   EQN: $\overline{A}+(\overline{CB}+\overline{DC}+\overline{E})\overline{F} = \overline{A}+\overline{BCF}+\overline{CDF}+\overline{EF}$

METHOD AND SYSTEM FOR IDENTIFYING FETS IMPLEMENTED IN A PREDEFINED LOGIC EQUATION

The present invention generally relates to identifying selected electronic logic gates in very large scale integrated ("VLSI") chips. More specifically, it relates to an improved method and system for identifying field effect transistors ("FETs") implemented in a predefined logic equation defined by at least one signal name from a netlist having output nodes, supply voltages with their opposite supply voltages, and FETs with their connectivity.

Computer aided design ("CAD") systems that design electronic circuits, often referred to as Electronic CAD ("ECAD") tools, assist in the design of electronic circuits by providing a user with a set of software tools running on a digital computer with a graphical display device. The design process has now become so complex that the current generation of integrated circuit (IC) chips, particularly in the case of VLSI chips, often cannot be designed without the help of ECAD tools. ECAD tools are ideally suited to performing tasks implemented in the circuit design process as they can break down large, complicated circuits into a plurality of circuits of relatively simpler functionality. The ECAD tools can then iteratively lay out these much simpler circuits and achieve the desired overall design of the desired large complicated circuit.

In performing a circuit design task, the ECAD tool generally allows for an user to schematically create and/or edit circuit designs by graphically placing and connecting circuit components, which can be represented as objects by the ECAD tool. The ECAD tool performs calculational circuit design and evaluation tasks for the schematic circuit, such as optimizing the circuit, testing the circuit through simulation modeling, and the like. As represented by the ECAD tool, the circuit may comprise a plurality of "nets," with each net representing a connection between the terminals of two transistors. A net may also be referred to as a signal. An ECAD tool also typically generates a "netlist," which is a list of a group of logically related nets, including connectivity data for each. The netlist may be in the form of a database. Also, the netlist may describe a multiplicity of nets that can number into the millions for VLSI chips. As a result, netlists can be of enormous size and complexity.

Different types of sub-tools of an ECAD tool may be used in IC design/evaluation tasks. In particular, ECAD tools can be used to identify the topology of a design stored on a netlist by identifying constituent FETs that comprise logic gates. A FET is defined as a transistor with a region of donor material with two terminals called the "source" and the "drain", and an adjoining region of acceptor material between, called the "gate". The voltage applied between the gate and the substrate controls the current flow between source and drain by depleting the donor region of its charge carriers to greater or lesser extent. There are generally two kinds of FETs: Junction FETs, (i.e., a FET in which the conducting channel lies between PN junctions in the silicon material. A PN junction acts as a diode, so it becomes conductive if the gate voltage gets reversed) and Metal Oxide Semiconductor FETs ("MOSFETs") (i.e., a FET in which the conducting channel is insulated from the gate terminal by a layer of oxide. Therefore, it does not conduct even if a reverse voltage is applied to the gate). A design may have thousands or millions of FETs on the chip, which makes it impractical to identify the topologies without the use of automated methods.

Current methods for identifying MOSFETs ("FETs") implemented in a predefined logic equation requires multiple circuit recognition schemes to be used. In particular, a circuit recognition scheme for each type of logic (e.g., NAND, NOR, AND, OR, etc.) must be separately detected. The alogorithm for identifying these FETs are typically implemented inside another ECAD tool for circuit analysis. Since the FETs used with each type of logic gate are identified separately, arbitrary functions cannot be recognized by these prior ECAD tools. Thus, there is a need for an improved method for identifying topologies of chip designs.

BRIEF SUMMARY OF THE INVENTION

The present invention is directed to an improved method and system for identifying selected logic functions in the topologies of a chip design. More specifically, it relates to an improved method and system for identifying FETs associated with a predefined logic equation defined by at least one signal name from a netlist having output nodes, supply voltages with their opposite supply voltages, and FETs with their connectivity.

The present invention provides a method that includes the steps of selecting an output node from the netlist, preparing the predefined logic equation for searching FETs in the netlist, and identifying FETs from the netlist that are implemented in the prepared predefined logic equation.

The present invention also provides a computer system that includes a storage medium, a processor for executing a program stored on the storage medium for identifying FETs implemented in a predefined logic equation from a netlist having output nodes, supply voltages with their opposite supply voltages, and FETs with their connectivity. The program that includes a set of instructions for selecting an output node from the netlist, preparing the predefined logic equation for searching FETs in the netlist, and identifying FETs from the netlist that are implemented in the prepared predefined logic equation.

DETAILED DESCRIPTION

Broadly stated, the present invention is directed to an improved method and system for identifying FETs implemented in a predefined logic equation from a netlist having output nodes, supply voltages with their opposite supply voltages, and FETs with their connectivity. An output node is first selected from the netlist, followed by the predefined logic equation being prepared for searching FETs in the netlist. FETs from the netlist that are implemented in the prepared predefined logic equation are then identified. The method and system provide a way to identify FETs implemented in a predefined logic equation from a netlist, which recognizes complicated combinational logic circuits, rather than a single gate.

Because the present invention is able to recognize the logic equation, FETs are identified without the need for multiple circuit recognition schemes. FETs no longer have to be identified separately for each type of logic. As a result, arbitrary functions can be recognized, since the present invention can automatically identify FETs given a predefined logic equation. Consequently, a less complex method is utilized for use with ECAD tool circuit analysis, while a more flexible and less cumbersome method is also provided. It should also be noted that the present invention is preferably implemented for static Complimentary MOS ("CMOS") FETs, which can have various alternative implementations. Thus, other alternative implementations for use with static CMOS FETs of various circuit designs are contemplated, and they are within the scope of the present invention.

Figure 1:
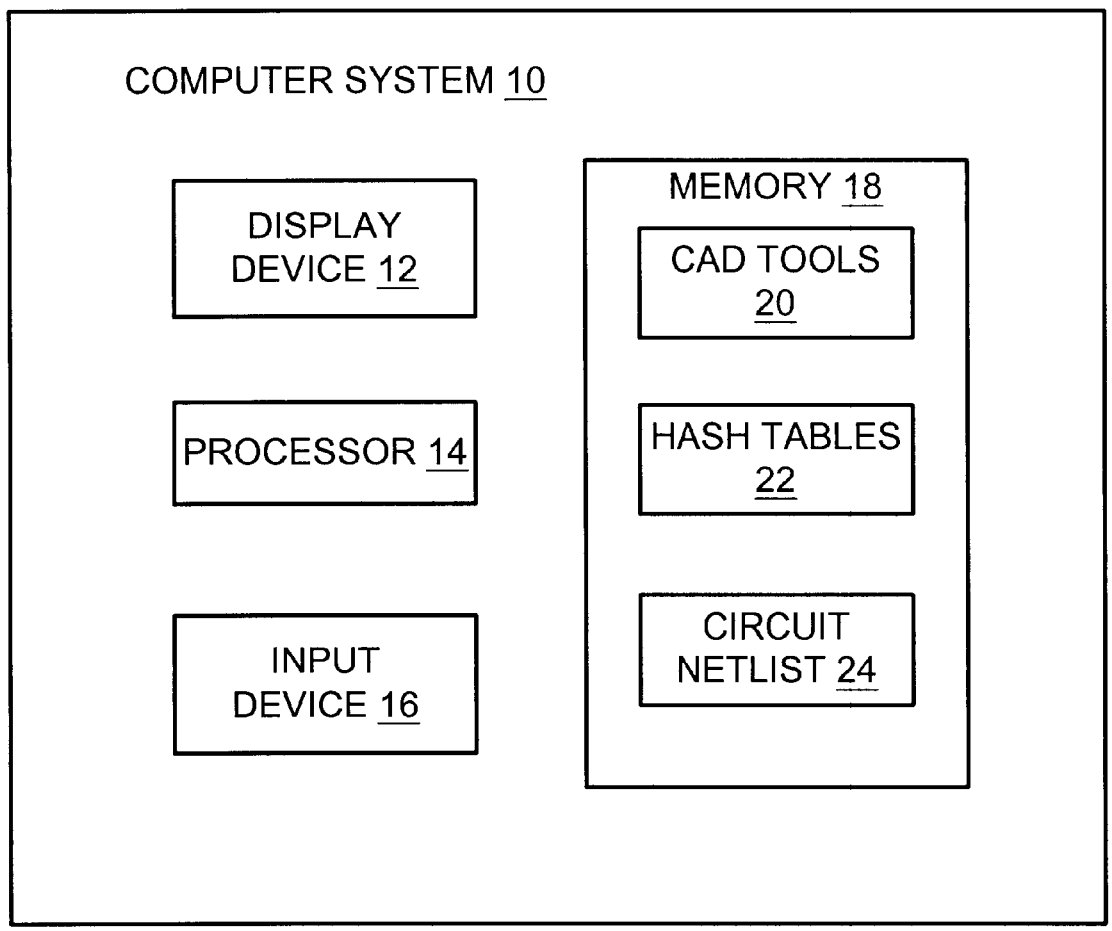
FIG. 1 shows a block diagram of a computer system on which the method may be performed.

A block diagram of a computer system on which the present invention may be implemented is shown in FIG. 1, and indicated generally at 10. As with most typical computer systems, there is a display device 12 for displaying data to users, a processor 14 for processing data, an input device 16 for users to input data, and memory 18 for storing the data. The processor 14 accesses the memory 18, which may store, among other things, CAD tools 20, hash tables 22 (a table for providing rapid access to data items, each of which is distinguished by some key) and a circuit netlist (herein "netlist") 24. The CAD tools 20 are stored in the memory 18 for analyzing the netlist 24, which is a data file for storing the topology of the chip design. The interconnection of the blocks is not shown as they are known to those skilled in the art. When in use, the input device 12 receives a command for instructing the processor 14 to call the CAD tool software 20 to perform a circuit analysis on the circuit netlist 24. During analysis, the processor 14 preferably creates a data structure, such as a hash table 22, in the memory 18 for storing information about the FETs. The result of the analysis may then be displayed on the display device 12 to the users.

As a result of the many possible implementations for the present invention, an explanation of the current preferred embodiment of the computer system is given as an example. The complexity of the various available implementations is furthered not only by the use of different file formats that can change, but also because of the software or firmware that is needed to work with the given desired file formats. In trying to present a clearer description of the present invention, an ECAD tool implementation will be used as an example. However, it should be understood that others skilled in the art can appreciate the implementations of the various systems and configurations, and these implementations are within the scope of the present invention.

Figure 2:
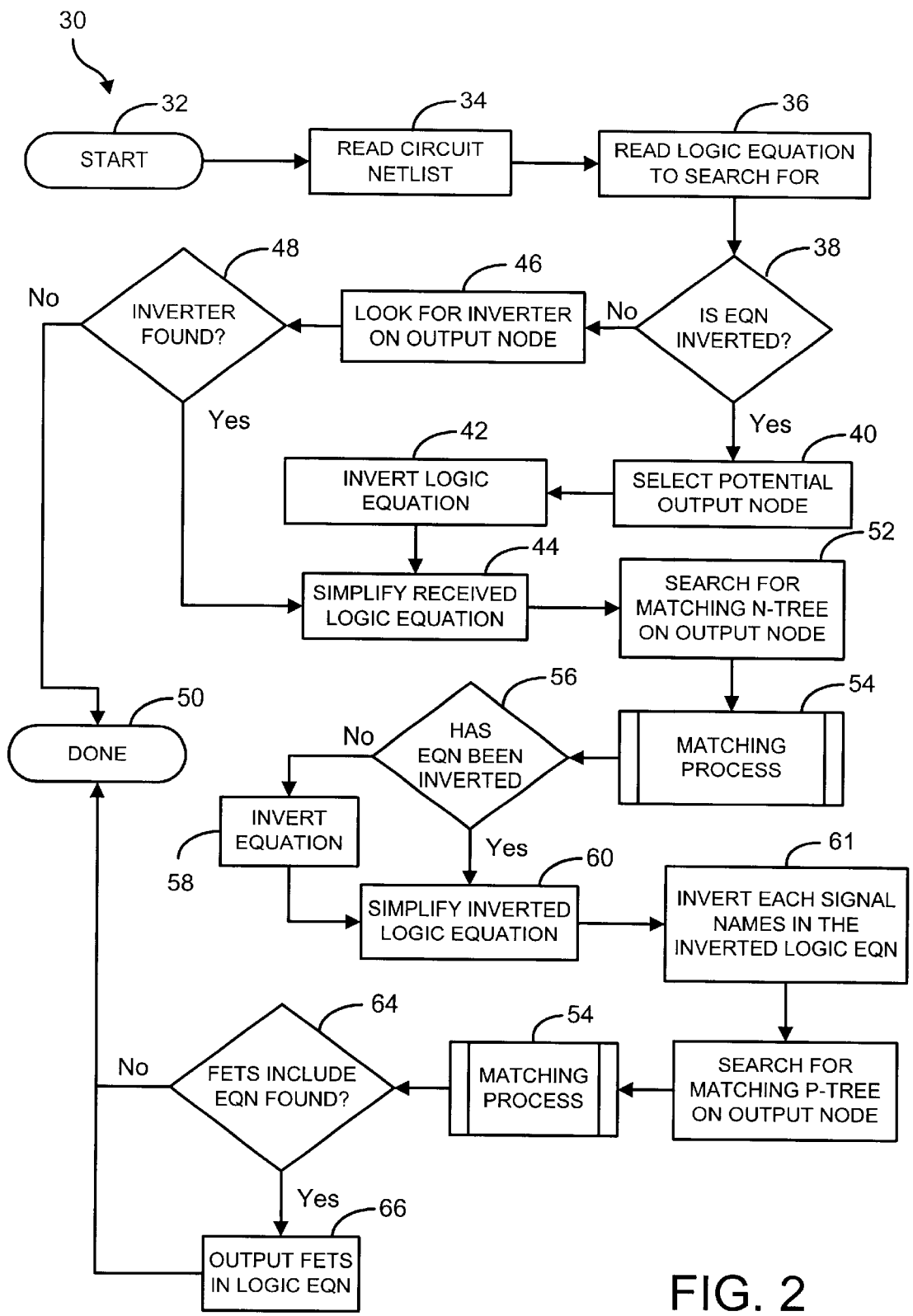
FIG. 2 is a flow chart illustrating the preferred functionality of a method of the present invention.

Turning to an important aspect of the present invention, a flow chart of the preferred functionality of a method of the present invention is shown in FIG. 2, and indicated generally at 30. The method is preferably initiated by a user, through the input device 16, calling a command to start the method. However, automatic initiation by a computer program is also contemplated, depending on the design and needs of the implementation. For example, the present invention can be implemented within another method, which automatically starts the present method upon a certain command. As noted, it should be understood that other various methods to initiate the present method are contemplated, and they are within the scope of the present invention.

Upon the start of the method (block 32), the first step is to read a circuit netlist (herein "netlist") (block 34) and a predefined logic equation (block 36) for use with the present invention. Both the netlist and the predefined logic equation are preferably provided by the users, but automatic processes are contemplated. For example, automatic iteration of multiple netlists and multiple logic equations can be implemented with the present method. However, for simplicity and clarity, an iteration using a single netlist and a single predefined logic equation is shown and described. Nevertheless, it should be understood other various implementations of the present method are contemplated, and they are within the scope of the present invention.

After a netlist (block 34) and a predefined logic equation (block 36) are read, the equation must be prepared before the FETs can be searched from the netlist. The equation is prepared differently depending whether the search is for either a N-tree or a P-tree, and the search can start with either of them first. For the present method shown, a search on the N-tree is first processed. However, it should be understood that alternative methods implemented with different orders are contemplated, and they are within the scope of the present invention.

Starting with a N-tree search for preparing the predefined logic equation, it is first determined whether the predefined logic equation is inverted mathematically (block 38). If the equation is inverted, the next step is to select a potential output node for the inverted equation (block 40), which is followed by another step of inverting the predefined logic equation (block 42). The logic equation is then simplified using simple algebraic steps (block 44).

If, on the other hand, the equation is not inverted, the next step is to find an inverter on the output node for the equation (block 46). It is then determined whether such an inverter is found (block 48). If not, the process ends at this point (block 50). Otherwise, the process continues and the predefined logic equation is simplified (block 44).

After the predefined logic equation (e.g., inverted or not inverted) is simplified (block 44), the logic equation is now prepared. The prepared logic equation is ready for searching a N-tree on the output node that matches the prepared logic equation (block 52), and initiating the matching process (block 54) shown in FIG. 3. The matching process will be later described in more detail. For the purpose of the discussion for FIG. 2, the matching process essentially identifies and saves the identified FETs from the N-tree that are implemented in the prepared logic equation to a data structure, such as a hash table.

After the FETs from the N-tree are identified, a similar preparation process is again done on the predefined logic equation for a search of the P-tree on the output node. More specifically, it is first determined whether the equation has been inverted in the previous steps (block 56). If not, the predefined logic equation is inverted (block 58). Once it is determined that the predefined logic equation is inverted, the inverted logic equation is then simplified (block 60). After the inverted logic equation is inverted, each of the signal names from the inverted logic equation also has to be inverted (block 61), which will give us the final prepared logic equation. Again, the predefined logic equation is prepared, but this time, the prepared logic equation is ready for searching the P-tree on the output node that matches the prepared logic equation (block 62). The matching process (block 54) shown in FIG. 3 is again initiated, and any identified FETs on the P-tree that are implemented in the prepared logic equation are saved to the hash table.

Once the identified FETs on both the N-tree and the P-tree are saved to the hash table, it is next determined whether any identified FETs were actually found by the matching process (block 64). If not, the process is completed and ends at this point (block 50). However, if identified FETs were found, these identified FETs would be outputted indicating that the logic equation has been confirmed to exist in addition of providing a list of FETs from the netlist that are implemented in the predefined logic equation (block 66). The method is completed and ends at this point (block 50).

Figure 3:
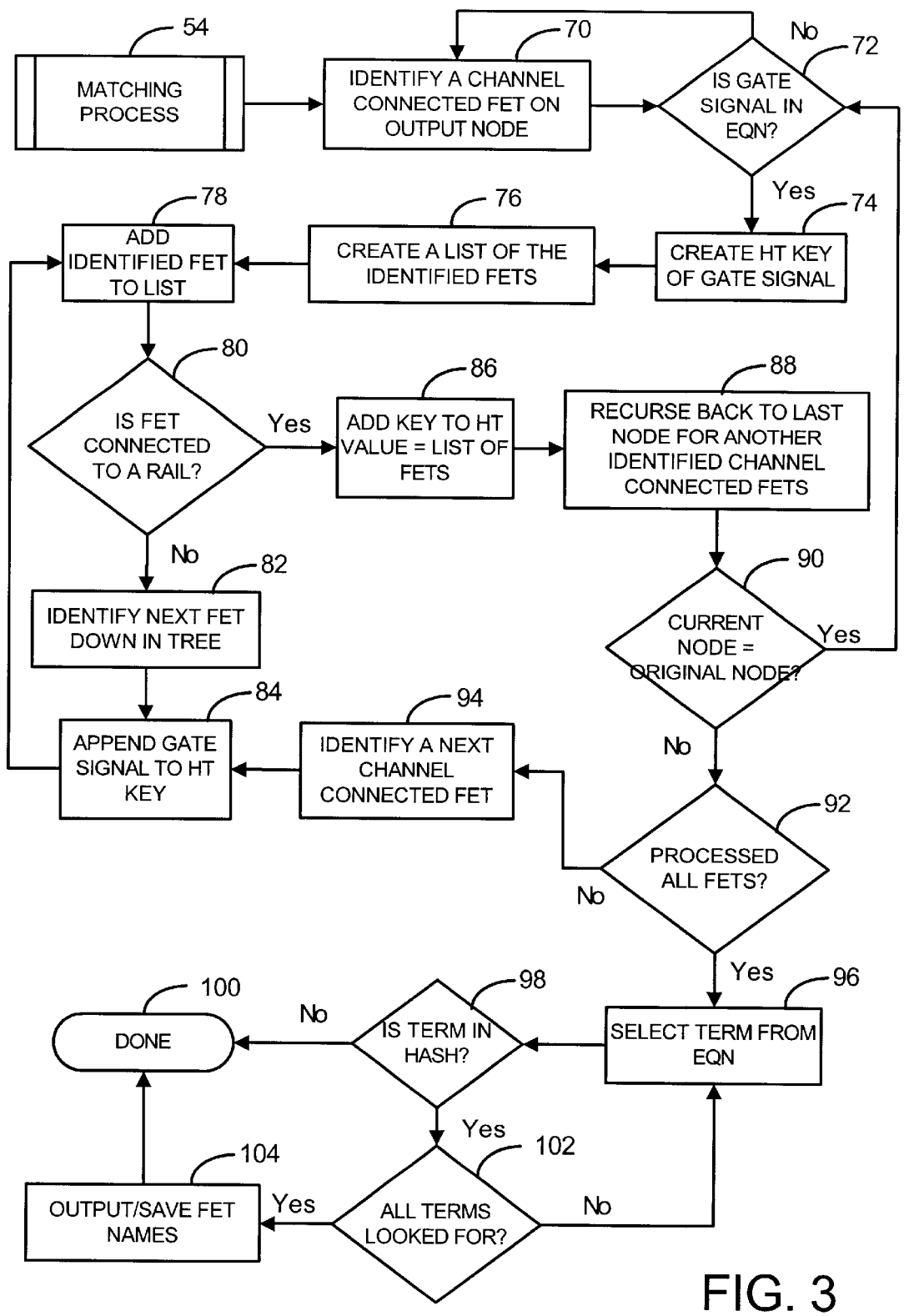
FIG. 3 is a flow chart illustrating the preferred functionality of a matching method shown in FIG. 2; and, FIG. 4 shows an example of interconnected FETs implemented in a predefined logic equation identified by the methods shown in FIGS. 2 and 3.

Turning now to another important aspect of the present invention, the matching method, followed from FIG. 2, is shown as a flow chart in FIG. 3, which is generally indicated at 54. FIG. 3 shows a preferred matching method for identifying FETs from the netlist that match the prepared predefined equation. The method first identifies a channel connected FET (i.e., FETs that are connected together from one's source to another's drain) on an output node (block 70), and determines whether the gate signal of the identified FET is in the predefined logic equation (block 72). If not, the process is looped back to identify another channel connected FET on an output node (block 70). However, if the gate signal of the identified FET is found in the prepared logic equation (block 72), a hash table ("HT") key is then created for the gate signal (block 74). A list for containing identified FETs is also created (block 76), and the identified FET is then accordingly added to the created list (block 78).

It is next determined whether the identified FET is directly connected to a supply voltage, such as a VDD or a GND (block 80). If not, the process continues and a next FET down the tree is identified (block 82). The gate signal of this next identified FET is then appended to the hash table key (block 84), and the process reloops back to the step of adding the identified FET to the list (block 78). This process keeps relooping until an identified FET is found to be connected to a supply voltage (e.g., VDD or GND) (block 80).

At this point, the hash table key along with its list of FETs is then added to the hash table (block 86). Then, the process recurses back to the last node with another identified channel connected FET (block 88). From the current node of the identified FET, it is next determined whether the current node is the same as the original node (block 90). If so, the process reloops back to the step of determining whether the gate signal of this identified FET is in the equation (block 72), and start all over again from that step. However, if the current node of the identified FET is not the same as the original node (block 90), it is determined whether all the FETs from the netlist have been processed (block 92). If not, the process identifies a next channel connected FET from the netlist (Block 94), and, with this new identified FET, reloops back to the step of appending the gate signal of the identified FET to the hash table key. The process starts all over again from that step.

If it has been determined that all FETs from the netlist have been processed (block 92), a term is selected from the prepared logic equation (block 96) for determining whether the selected term is found in the hash table (block 98). If not, the process ends (block 100), since the identified FETs in the list are not part of the predefined logic equation. If, on the other hand, the selected term is found in the hash table (block 98), it is determined whether all the terms from the prepared logic equation have been processed (block 102). If not, the process loops back and starts from the step of selecting another term from the equation (block 96) until all the terms from the prepared logic equation have been processed (block 102). Finally, the identified FETs, which have been confirmed as an implementation of the predefined logic equation, are then outputted from the hash table (block 104), and the method process ends (block 100) and returns to the method shown in FIG. 2.

As shown, the present method identifies FETs that are implemented in a predefined logic equation by recognizing the predefined logic equation itself. As a result, FETs are identified without the need for multiple circuit recognition schemes, and FETs no longer have to be identified separately using each of the logic types. Accordingly, since the present invention can automatically identify FETs given a predefined logic equation, arbitrary functions can easily be recognized. Thus, a more flexible and less cumbersome method is provided by the present invention. However, although the preferred method shown is implemented for an iteration of a single logic gate, it should be noted that alternative methods can be used for the present invention. For example, it is contemplated that the method can be relooped for identifying multiple logic gates from a single netlist or multiple netlists. Thus, it should be understood that these other alternative methods are contemplated and they are within the scope of the present invention. In addition, to clarify the methods described, an example of interconnected FETs implemented in a predefined logic equation shown in FIG. 4 will be described using the method shown in FIG. 3.

Figure 4:
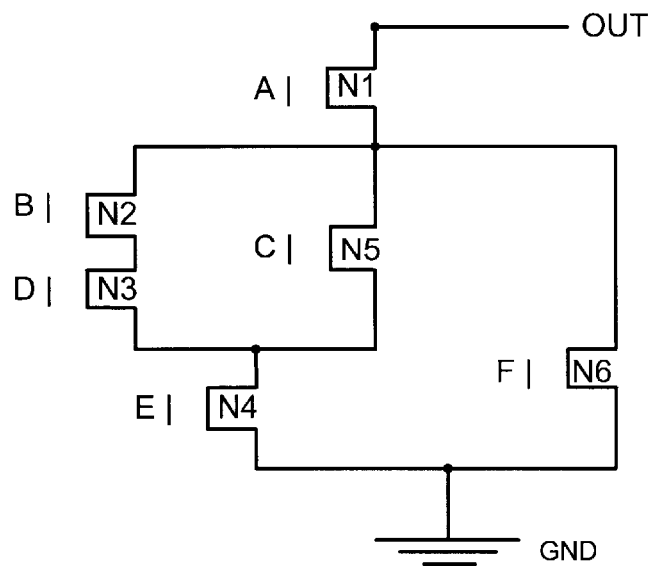
Figure 4:
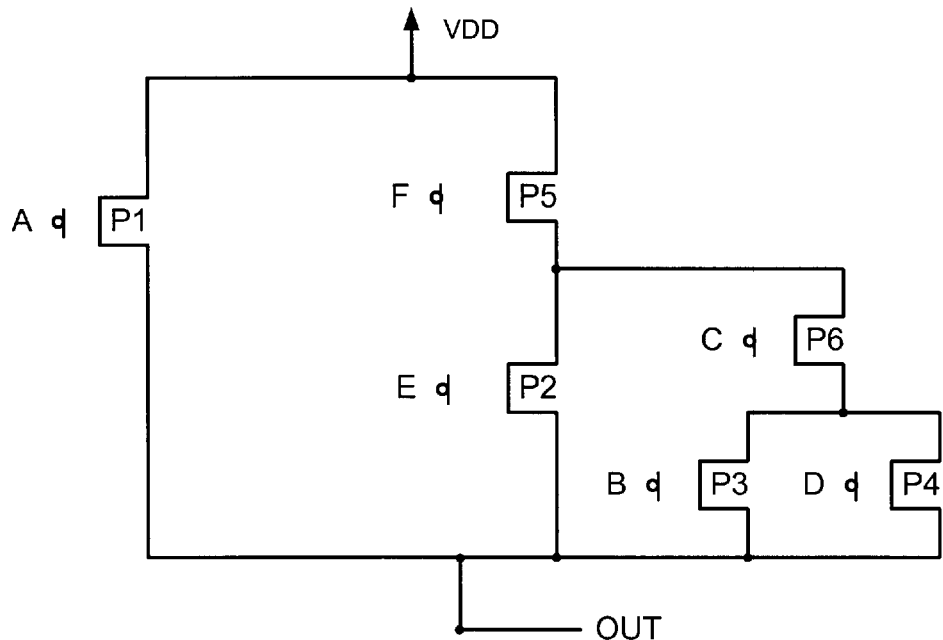

An example of interconnected FETs implemented in a predefined logic equation is shown in FIG. 4. Turning first to FIG. 4, both a N-tree and a P-tree are included with an equation of $$\overline{A[(BD+C)E+F]}.$$

As shown, please note that the equation has been inverted and simplified for the N-tree. In contrast, the equation is simplified but not inverted for the P-tree. The purpose of the inverting the predefined logic equation is so that sum-of-products form of the equation can be latter mapped back to the hash table keys for the N tree. The inversion has to be done for the N-tree and not the P-tree because when conducting current, the N-tree will pull the output voltage to a logic "0", resulting in the negation of the equation. Conversely, when a P-tree is conducting current, it pulls the output voltage to a logic "1." Thus, inversion is not needed for the P-tree, since it is not in the negation of the equation. Once the predefined logic equation is inverted, each of the signal names is also inverted, as shown in FIG. 4. The predefined logic equation is prepared from the method shown in FIG. 2, and these prepared equations are then compared in the matching process shown in FIG. 3.

Using the method shown in FIG. 3 with the example shown in FIG. 4, the first step of the matching method is to identify a channel connected FET on the output node (block 70). It should be noted that the N-tree FETs and the P-tree FETs are evaluated separately in FIG. 2, but in this example, the processes will be discussed concurrently. In the N-tree, N1 is the only channel connected FET on the output node, whereas either one of P1, P2, P3 and P4 could have been selected as the identified channel connected FET.

As an example, N1 and P1 will be selected for the next step of determining whether the gate signal of the identified FET is in the prepared equation (block 72), and the answer for both N1 and P1 is true. In particular, N1 and P1 both have a gate signal of A, which is found in both prepared equations of the N-tree and the P-tree. As a result, a hash table key (e.g., N-tree: key1=A; P-tree: key10=A) (block 74) and a list (block 76) will be created for both N1 and P1. The identified FETs (i.e., N1 and P1) will both be added to their respective lists (e.g., N-tree: valueKey1=N1; P-tree: valueKey10=P1) (block 78).

It is next determined whether the identified FETs are connected to a supply voltage (block 80). As shown in the N-tree, N1 is not connected to a supply voltage (e.g., GND). As a result, the next FET down in the tree is identified (block 82), which is N2 with a gate signal of B. The gate signal B of FET N2 is appended to the hash table key (block 84) and the FET is added to the list (block) (i.e., N-tree: key1=AB and valueKey1=N1, N2). Since N2 is not directly connected to a supply voltage, the next FET of N3 having gate signal D is identified down the tree. Accordingly, D is appended to the hash table key, and N3 is added to the list (i.e., N-tree: key1=ABD and valueKey1=N1, N2, N3). FET N4 with gate signal E is similarly identified, and appended to the key and the list (i.e., N-tree: key1=ABDE and valueKey1=N1, N2, N3, N4). However, this time, FET N4 is connected to a supply voltage (e.g., GND). Also, as it turns out, P1 in the P-tree is also connected to a supply voltage (e.g., VDD). As a result, the key and the list of both the N-tree and the P-tree will be added to the hash table (i.e., N-tree: key1=ABDE and valueKey1=N1, N2, N3, N4; P-tree: key10=A and valueKey10=P1).

The next step is to recurse back to the last node with another identified channel connected FET (block 88), and determine whether the current node is the same as the original node. In recursing back, N1 is selected again in the N-tree since it is the only FET connected to an output node, and either P2, P3 or P4 can be selected. Accordingly, N1 and P2 will be selected and processed, and so on and so on. Going through the iterations for all the FETs on the trees, the hash table will eventually end up with the following entries: (1) N-tree: key1=ABDE, key2=ACE, key3=AF; valueKey1=N1, N2, N3, N4, valueKey2=N1, N4, N5, valueKey3=N1, N6 and (2) P-tree: key10=A, key11=EF, key12=BCF, key13=CDF; valueKey10=P1, valueKey11= P2, P5, valueKey12=P3, P5, P6, valueKey13=P4, P5, P6.

Now that it appears that all the FETs have been processed, a term from the prepared equation is selected and checked against the hash table to determine whether there is a match. In particular, a term (e.g., ABDE) is selected from the prepared equation (i.e., ABDE+ACE+AF) in the N-tree, and determined whether the term matches any entries in the hash table. In this case, key1 (i.e., ABDE) of the N-tree matches the selected term (i.e., ABDE). Similarly, in the P-tree, the term $\overline{A}$ from the prepared equation $\overline{A}+\overline{BCF}+\overline{CDF}+\overline{EF}$ matches key10 of A. This process is iterated until all the terms from the prepared equation have been processed. Since all the terms of the prepared equations are found in the hash table, the FETs are outputted, specifically, the value with the list of the FETs (i.e., N-tree: valueKey1=N1, N2, N3, N4, valueKey2=N1, N4, N5, valueKey3=N1, N6; P-tree: valueKey10=P1, valueKey11=P2, P5, valueKey12= P3, P5, P6, valueKey13=P4, P5, P6) are outputted. The process is now complete.

From the foregoing description, it should be understood that an improved system and method for identifying FETs implemented in a predefined logic equation have been shown and described, which have many desirable attributes and advantages. The system and method provide a way for FETs that are implemented in a predefined logic equation to be identified without the need for multiple circuit recognition schemes. In particular, users no longer have to manually determine the logic equation by separately identifying FETs for each type of logic (e.g., NAND, NOR, AND, OR, etc.). Accordingly, arbitary functions can be recognized, the present invention can automatically identify the FETs given a predefined logic equation. Thus, a less complex method is utilized for use with ECAD tool circuit analysis, while a more flexible and less cumbersome method is provided by the present invention.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for identifying FETs implemented in a predefined logic equation defined by at least one signal name from a netlist having output nodes, FETs and their connections, said method comprising the steps of:
   selecting an output node from the netlist;
   preparing the predefined logic equation for searching FETs in the netlist; and,
   identifying FETs from the netlist that are implemented in the prepared predefined logic equation;
   wherein said preparing step further comprises:
      searching for a N-tree on the selected output node from the netlist that matches the prepared predefined logic equation;
      determining whether the predefined equation is inverted;
      finding an inverter on the output node when the predefined equation is not inverted;
      determining whether an inverter is found;
      simplifying the predefined equation when an inverter is found; and,
      aborting the process when an inverter is not found.

2. The method according to claim 1 wherein prior to said searching step, said preparing step comprises the steps of:
   determining whether the predefined equation is inverted;
   selecting a potential output node when the predefined equation is inverted;
   inverting the logic equation; and,
   simplifying the inverted logic equation.

3. The method according to claim 1 wherein said step of outputting the identified FETs further comprises the steps of:
   determining whether there is any identified FETs that matches the predefined logic equation is found; and,
   ending the process when no identified FETs that matches the predefined logic equation is found.

4. The method according to claim 1 further comprising the step of outputting information concerning said identified FETs.

5. A method for identifying FETs implemented in a predefined logic equation defined by at least one signal name from a netlist having output nodes, FETs and their connections, said method comprising the steps of:
   selecting an output node from the netlist;
   preparing the predefined logic equation for searching FETs in the netlist; and,
   identifying FETs from the netlist that are implemented in the prepared predefined logic equation;
   wherein said preparing stem further comprises:
      searching for a P-tree on the selected output node from the netlist that matches the prepared predefined logic equation;
      determining whether the predefined logic equation is inverted;
      simplifying the inverted predefined logic equation; and,
      inverting each signal name in the inverted predefined logic equation.

6. The method according to claim 5 wherein said determining step further comprises the step of inverting the predefined equation when the predefined equation is not inverted.

7. A method for identifying FETs implemented in a predefined logic equation defined by at least one signal name from a netlist having output nodes, FETs and their connections, said method comprising the steps of:

selecting an output node from the netlist;

preparing the predefined logic equation for searching FETs in the netlist; and, identifying FETs from the netlist that are implemented in the prepared predefined logic equation;

wherein said identifying step further comprises:

identifying a channel connected FET on the output node;

determining whether the gate signal of the identified FET is in the predefined logic equation;

creating a hash table key for the gate signal of the identified FET when the gate signal is in the predefined logic equation; and, adding said identified FET to a list associated with the hash table key.

8. The method according to claim 7 wherein said determining step further comprises a step of identifying a next channel connected FET on the output node when the gate signal of the identified FET is not in the predefined logic equation.

9. The method according to claim 7 wherein said adding step further comprises the step of creating an empty list.

10. The method according to claim 7 further comprising the steps of:

determining whether the identified FET is connected to a supply voltage;

identifying a next FET down the tree when the identified FET is not connected to a supply voltage;

appending the gate signal of the next identified FET to the hash table key;

adding the next identified FET to the list.

11. The method according to claim 7 further comprising the steps of:

determining whether the identified FET is connected to a supply voltage;

adding the hash table key associated to the list of FETs to a hash table when the identified FET is connected to a supply voltage; and, performing a recursion back to the last node with another identified channel connected FET.

12. The method according to claim 11 wherein said performing step further comprising the steps of:

determining whether the current node of the identified FET is the same as the original node;

relooping the identified FET to the step of determining whether the gate signal of the identified FET is in the predefined logic equation when the identified FET is the current node is the same as the original node; and, determining whether all FETs from the netlist have been processed when the current node is not the same as the original node.

13. The method according to claim 11 wherein said step of determining whether all FETs from the netlist have been processed further comprising the steps of:

identifying a next channel connected FET when not all FETs have been processed; and, relooping the identified FET to the step of appending the gate signal of the next identified FET to the hash table key.

14. The method according to claim 11 wherein said step of determining whether all FETs from the netlist have been processed further comprising the steps of:

selecting a term from the prepared logic equation;

determining whether the selected term matches a hash table key in the hash table;

determining whether all terms from the prepared logic equation has been processed when the selected term is in the hash table.

15. The method according to claim 14 wherein said step of determining whether all terms from the prepared logic equation have been processed further comprises the steps of:

relooping to the step of selecting a term from the prepared logic equation for a next term in the prepared logic equation when not all terms have been processed; and, saving the identified FETs associated to the matched hash table key to a data file once all terms from the prepared logic equation has been processed.

16. A computer system for identifying FETs implemented in a predefined logic equation from a netlist having output nodes, FETs and their connections, comprising:

a storage medium;

a processor for executing a program stored on the storage medium for identifying FETs implemented in a predefined logic equation from a netlist having output nodes, supply voltages with their opposite supply voltages, and FETs with their connectivity, the program comprising a set of instructions for:

selecting an output node;

preparing the predefined logic equation for searching FETs in the netlist;

identifying FETs from the netlist that are implemented in the prepared predefined logic equation; and, outputting the identified FETs:

wherein said preparing step further comprises:

searching for a N-tree on the selected output node from the netlist that matches the prepared predefined logic equation;

determining whether the predefined equation is inverted;

finding an inverter on the output node when the predefined equation is not inverted;

determining whether an inverter is found;

simplifying the predefined equation when an inverter is found; and, aborting the process when an inverter is not found.

17. A computer program product comprising a computer usable medium having computer readable program codes embodied in the medium that when executed causes a computer to:

selecting an output node;

prepare a predefined logic equation for searching FETs in a netlist;

identify FETs from the netlist that are implemented in the prepared predefined logic equation; and, output the identified FETs;

wherein said preparing step further comprises:

searching for a N-tree on the selected output node from the netlist that matches the prepared predefined logic equation;

determining whether the predefined equation is inverted:

finding an inverter on the output node when the predefined equation is not inverted;

determining whether an inverter is found;

simplifying the predefined equation when an inverter is found; and, aborting the process when an inverter is not found.

18. A computer system for identifying FETs implemented in a predefined logic equation from a netlist having output nodes, FETs and their connections, comprising:

a storage medium;

a processor for executing a program stored on the storage medium for identifying FETs implemented in a predefined logic equation from a netlist having output nodes, supply voltages with their opposite supply voltages, and FETs with their connectivity, the program comprising a set of instructions for:

selecting an output node;

preparing the predefined logic equation for searching FETs in the netlist;

identifying FETs from the netlist that are implemented in the prepared predefined logic equation; and, outputting the identified FETs;

wherein said identifying step further comprises:

identifying a channel connected FET on the output node;

determining whether the gate signal of the identified FET is in the predefined logic equation;

creating a hash table key for the gate signal of the identified FET when the gate signal is in the predefined logic equation; and, adding said identified FET to a list associated with the hash table key.

19. A computer program product comprising a computer usable medium having computer readable program codes embodied in the medium that when executed causes a computer to:

selecting an output node;

prepare a predefined logic equation for searching FETs in a netlist;

identify FETs from the netlist that are implemented in the prepared predefined logic equation; and, output the identified FETs;

wherein said preparing stem further comprises:

searching for a P-tree on the selected output node from the netlist that matches the prepared predefined logic equation;

determining whether the predefined logic equation is inverted;

simplifying the inverted predefined logic equation; and, inverting each signal name in the inverted predefined logic equation.

20. A computer program product comprising a computer usable medium having computer readable program codes embodied in the medium that when executed causes a computer to:

selecting an output node;

prepare a predefined logic equation for searching FETs in a netlist;

identify FETs from the netlist that are implemented in the prepared predefined logic equation; and, output the identified FETs;

wherein said identifying step further comprises:

identifying a channel connected FET on the output node;

determining whether the gate signal of the identified FET is in the predefined logic equation;

creating a hash table key for the gate signal of the identified FET when the gate signal is in the predefined logic equation; and, adding said identified FET to a list associated with the hash table key.

\* \* \* \* \*